United States Patent
Kim

(10) Patent No.: US 8,189,398 B2
(45) Date of Patent: May 29, 2012

(54) READ OPERATION METHOD OF MEMORY DEVICE

(75) Inventor: Chan Ho Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 332 days.

(21) Appl. No.: 12/691,772

(22) Filed: Jan. 22, 2010

(65) Prior Publication Data

US 2010/0195407 A1 Aug. 5, 2010

(30) Foreign Application Priority Data

Feb. 2, 2009 (KR) .................. 10-2009-0007908

(51) Int. Cl.
*G11C 16/06* (2006.01)

(52) U.S. Cl. ......... 365/185.25; 365/185.17; 365/185.18; 365/185.21

(58) Field of Classification Search .................. None
See application file for complete search history.

(56) References Cited

U.S. PATENT DOCUMENTS

| | | | | |
|---|---|---|---|---|
| 6,088,265 A * | 7/2000 | Ohta | ........................ | 365/185.16 |
| 6,594,180 B2 * | 7/2003 | Pascucci | .................. | 365/185.18 |
| 6,807,096 B2 * | 10/2004 | Toda | ........................ | 365/185.03 |
| 7,826,272 B2 * | 11/2010 | Sakoh | ........................ | 365/185.2 |
| 8,054,692 B2 * | 11/2011 | Kang et al. | ................ | 365/185.25 |

FOREIGN PATENT DOCUMENTS

| | | |
|---|---|---|
| JP | 2001-093288 A | 4/2001 |
| KR | 1020050007653 A | 1/2005 |
| KR | 1020050073297 A | 7/2005 |
| KR | 1020080038656 A | 5/2008 |

* cited by examiner

*Primary Examiner* — Tan T. Nguyen
(74) *Attorney, Agent, or Firm* — Volentine & Whitt, PLLC

(57) ABSTRACT

A read operation method of a memory device includes applying a first voltage to each of a first memory cell and a second memory cell during a first read operation, applying the first voltage to the first memory cell and a second voltage to the second memory cell during a second read operation, and applying the second voltage to the first memory cell and the first voltage to the second memory cell during a third read operation.

17 Claims, 7 Drawing Sheets

READ OPERATION METHOD OF MEMORY DEVICE

CROSS-REFERENCE TO RELATED APPLICATIONS

A claim of priority under 35 U.S.C. §119 is made to Korean Patent Application No. 10-2009-0007908, filed on Feb. 2, 2009, the entirety of which is incorporated herein by reference.

BACKGROUND

The inventive concepts described herein are generally related to a read operation method of a memory device, and more particularly to a read operation method of a NAND flash memory device.

Semiconductor memory devices may be classified into volatile memory devices and non-volatile memory devices, according to whether stored data is lost when power supply to the memory device is discontinued. Flash memory devices are a type of non-volatile memory devices, and may be classified into NAND flash memory devices in which cell transistors are arranged in series between a bit line and ground and NOR flash memory devices in which the cell transistors are arranged in parallel between the bit line and ground.

The read operation of the NAND flash memory device is performed by units of pages. Data, that is a program or erase state of each memory cell connected to a selected word line of a selected block, is determined by a page buffer circuit detecting a bit line voltage.

The memory cell may be classified into an on-cell (or erased cell) and an off-cell (or programmed cell) according to whether the memory cell is programmed or not. The off-cell has a high threshold voltage as electrons are injected into a floating gate of the cell transistor. The on-cell refers to a memory cell having a low threshold voltage as it remains in an erase state.

According to the read operation of a conventional flash memory device, in the initial stand-by state or idle state before the read operation is performed, the bit line is discharged to a ground voltage VSS. When the read operation starts as a read command and an address command are input, the address of a cell to be read, or a selected cell, is set up and only a bit line, or a selected bit line, to which the selected cell is connected is precharged to a power voltage VDD by the input of an address corresponding to the set-up address.

After the selected bit line is precharged, the selected bit line is developed according to whether the selected cell is an on-cell or an off-cell. After the selected bit line is developed, a change of a voltage of the selected bit line is detected and amplified. The amplifier outputs an amplified data. After the read operation is completed, the selected bit line is discharged back to the ground voltage VSS through a recovery operation so that all bit lines may be in a discharged state. Accordingly, the memory device is returned to the stand-by state or idle state. The read operation of the flash memory device may be performed by repeating the above-described series of steps.

However, in the read operation of the conventional flash memory device, since the above-described precharge, discharge, develop, sensing, and recovery operations need to be repeated for each selected cell, the speed of the read operation may be reduced. Also, due to the repetition of the above read operation, a read disturb characteristic of the flash memory may be deteriorated.

SUMMARY

Exemplary embodiments of the inventive concept are generally related to a read operation method of a memory device which may improve read operation speed of a flash memory and read disturb characteristics.

In an embodiment of the inventive concept, there is provided a read operation method of a memory device including applying a first voltage to each of a first memory cell and a second memory cell during a first read operation, applying the first voltage to the first memory cell and a second voltage to the second memory cell during a second read operation, and applying the second voltage to the first memory cell and the first voltage to the second memory cell during a third read operation.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
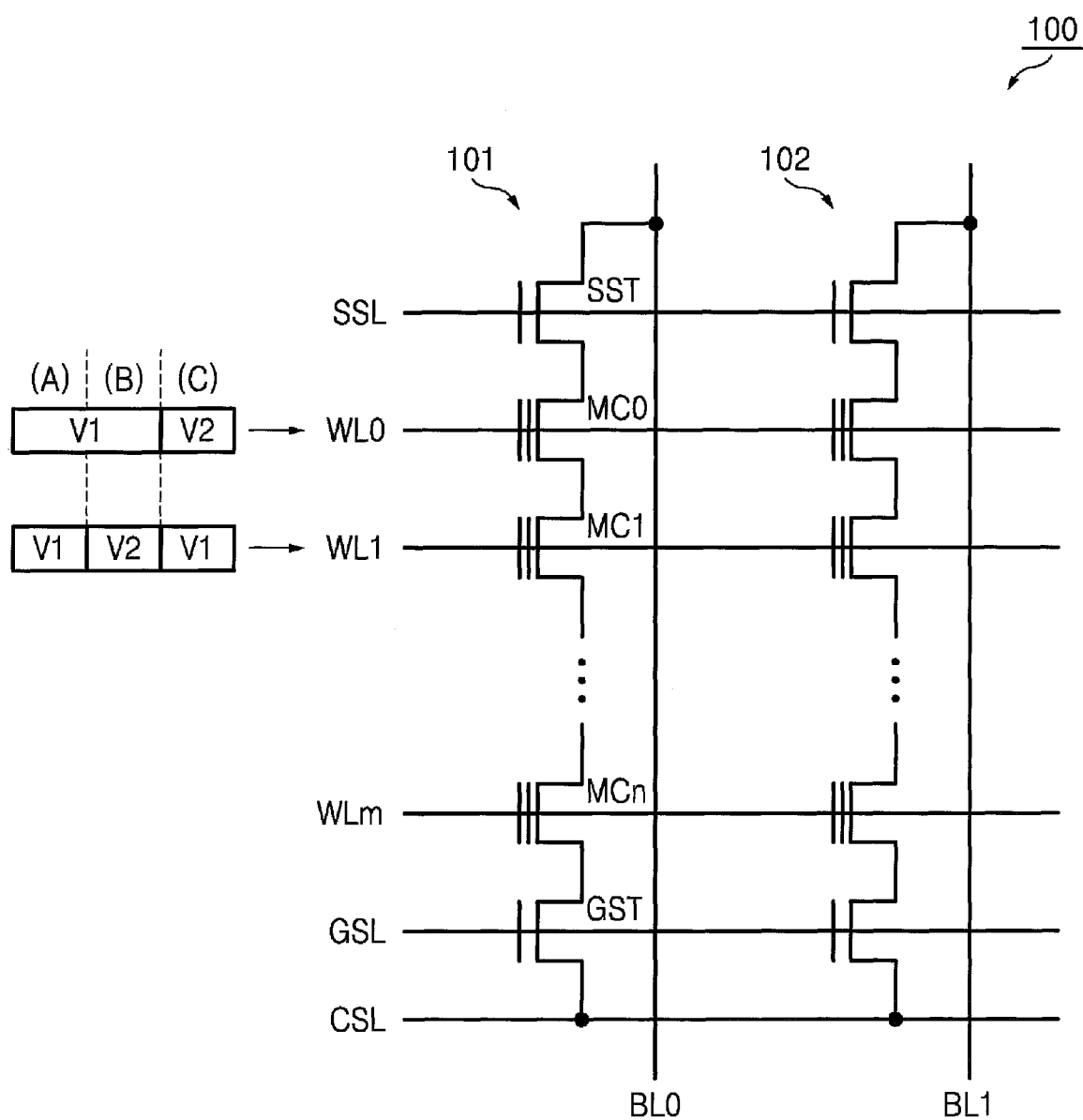
FIG. 1 illustrates a schematic circuit diagram of a memory cell array of a memory device according to an exemplary embodiment of the inventive concept.

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

FIG. 1 is a schematic circuit diagram of a memory cell array 100 of a memory device according to an exemplary embodiment of the inventive concept. Referring to FIG. 1, a memory device according to the exemplary embodiment may include the memory cell array 100 in which a plurality of cell strings 101 and 102 respectively connected to bit lines BL0 and BL1 are formed.

Each of the cell strings 101 and 102 may include a string selection transistor SST, a ground selection transistor GST, and a plurality of memory cells MC0, MC1, . . . , MCn. Each of the string selection transistors SST may include a drain connected to the bit line and a gate connected to a string selection line SSL. Each of the ground selection transistor GST may include a source connected to a common source line CSL and a gate connected to a ground selection line GSL. The memory cells MC0, MC1, . . . , MCn that are respectively connected to a plurality of word lines WL0, WL1, . . . , WLm may be connected in series between the source of the string selection transistor SST and the drain of the ground selection transistor GST.

Each of the word lines WL0, WL1, . . . , WLm may receive a predetermined voltage from, for example, an external voltage controller (not shown), according to the operation of the memory device, for example the read operation or write operation of the memory device.

Figure 2:
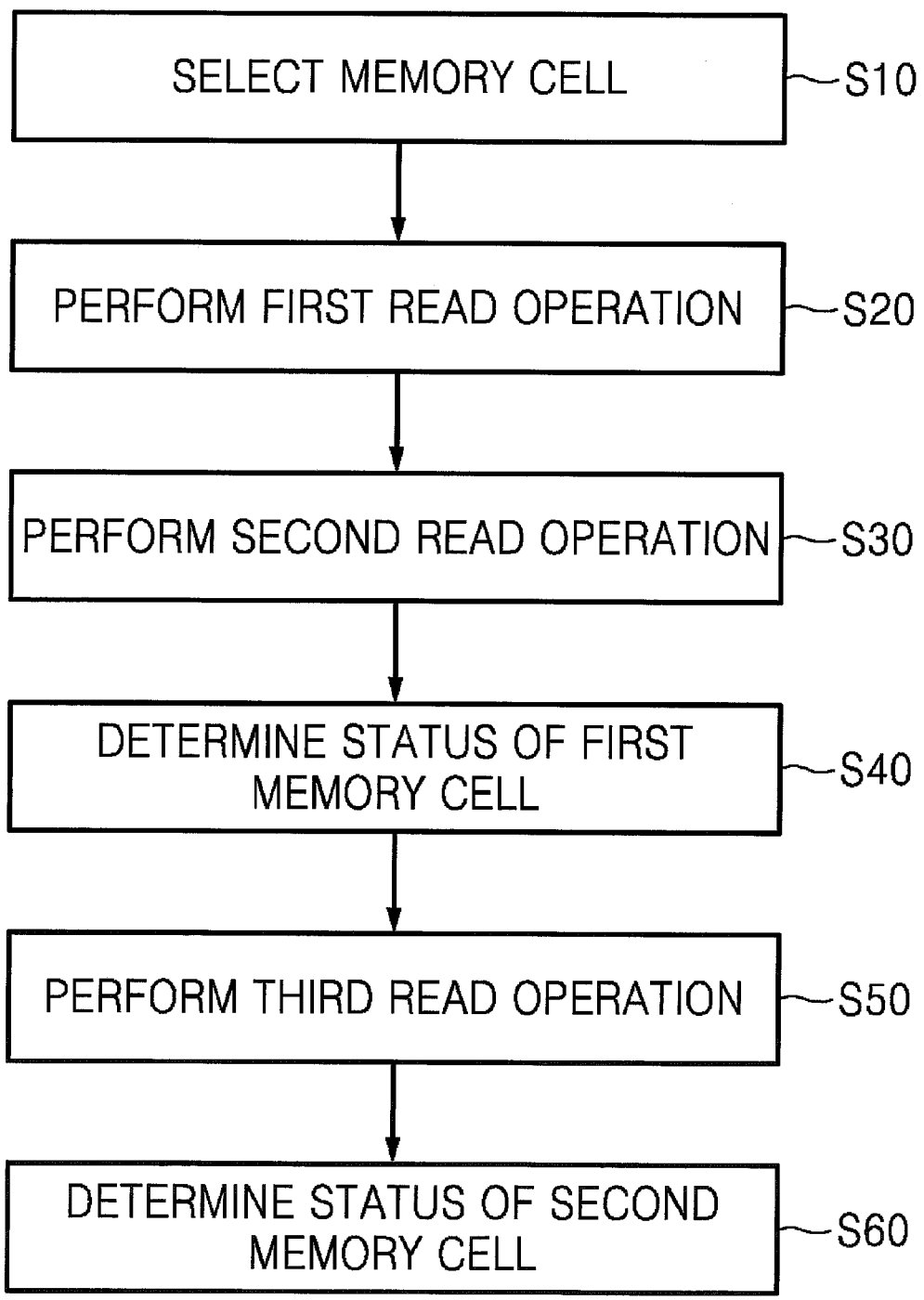
FIGS. 2 and 3 illustrate flowcharts for explaining the read operation of the memory device of FIG. 1.
Figure 3:
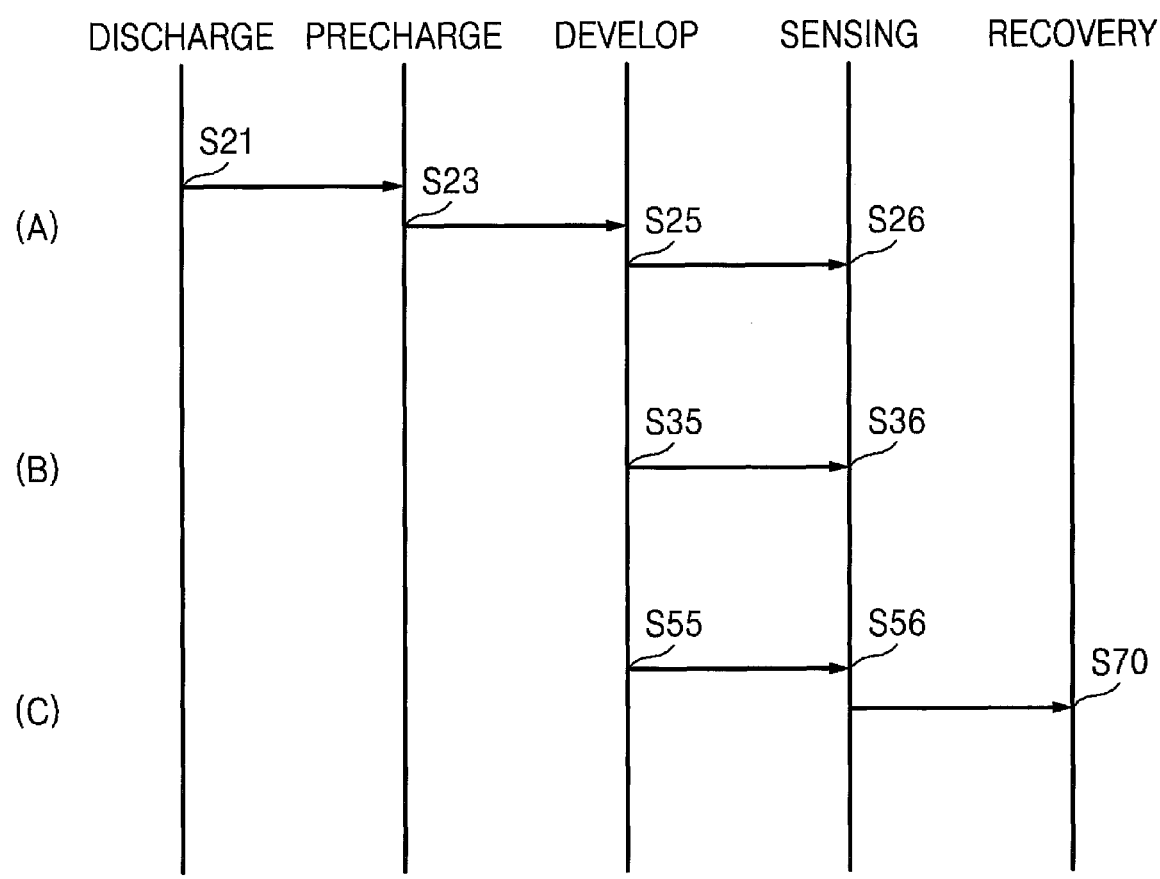
Figure 4:
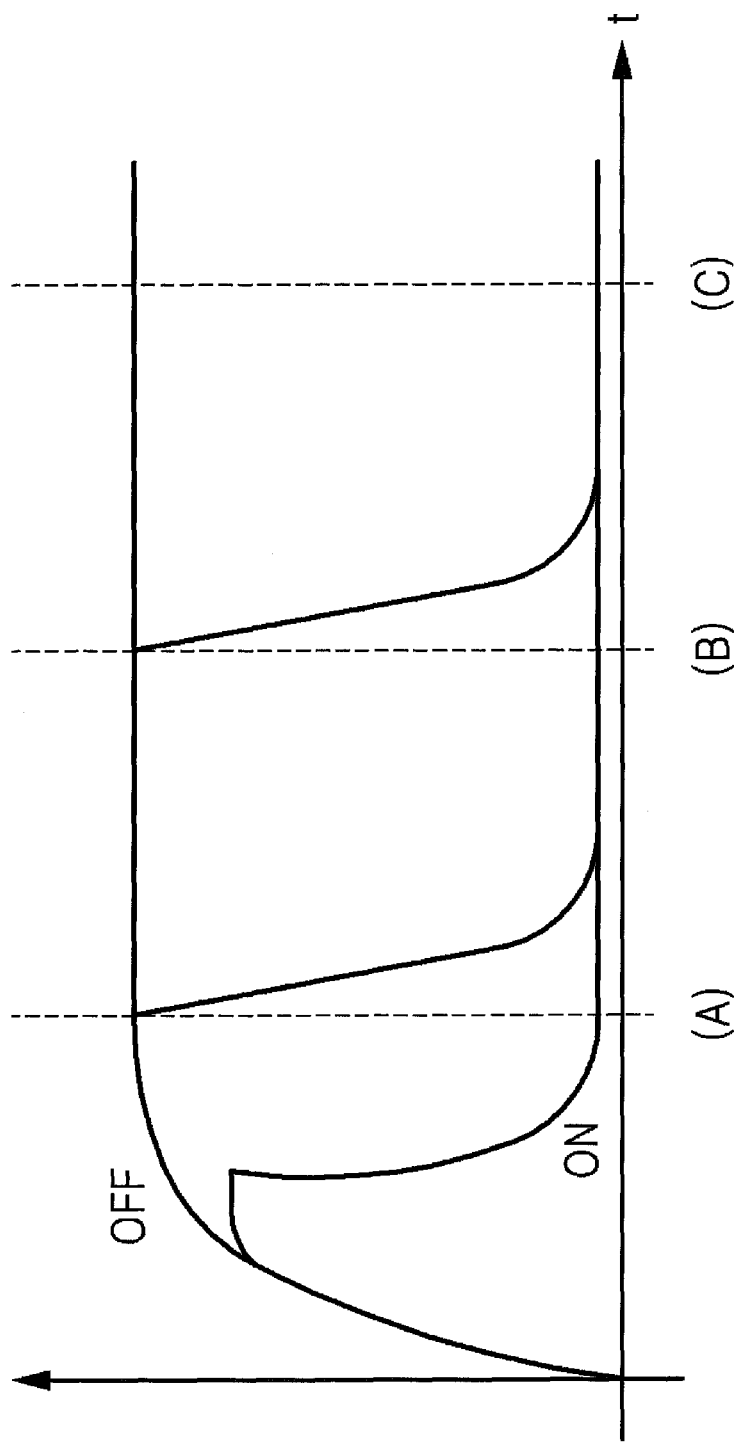
FIG. 4 is a development characteristic graph according to the operation flowchart of the memory device of FIGS. 2 and 3.

FIGS. 2 and 3 are flowcharts for explaining the read operation of the memory device of FIG. 1. FIG. 4 is a development characteristic graph according to the operation flowchart of the memory device of FIGS. 2 and 3. Table 1 shows a result of the read operation of the memory device according to the flowcharts of FIGS. 2 and 3 showing the operation of the memory device.

TABLE 1

| | Status | | | |
|---|---|---|---|---|
| First memory cell | OFF | ON | ON | OFF |
| Second memory cell | OFF | ON | OFF | ON |
| First read operation result | OFF | ON | OFF | OFF |
| Second read operation result | OFF | ON | ON | OFF |
| First memory cell status determination | OFF | ON | ON | OFF |
| Third read operation result | OFF | ON | ON | ON |
| Second memory cell status determination | OFF | ON | OFF | ON |

Referring to FIGS. 1-4 and Table 1, the memory device according to this exemplary embodiment of the inventive concept may sequentially perform a first read operation (S20), a second read operation (S30), and a third read operation (S50).

The memory device may select at least two memory cells to perform a read operation (S10). For example, the memory device may select one, for example the first cell string 101, of the cell strings 101 and 102. Also, at least two memory cells MC0 and MC1 to perform the read operation may be selected from the memory cells MC0, MC1, . . . , MCn of the selected first cell string 101.

The first memory cell MC0 may be connected to the first word line WL0 and the second memory cell MC1 may be connected to the second word line WL1. Also, the first cell string 101 including the first and second memory cells MC0 and MC1 may be connected to one of the bit lines, for example, the first bit line BL0.

When the selection of the first and second memory cells MC0 and MC1 is completed, the memory device may perform a first read operation S20 including a discharge operation S21, a precharge operation S23, a develop operation S25 and a sensing operation S26 (S20).

In the discharge operation S21 of the first read operation A, before a read operation is performed with respect to each of the selected first and second memory cells MC0 and MC1, the bit line, that is the first bit line BL0, to which the first and second memory cells MC0 and MC1 are connected may be discharged to a predetermined voltage, for example, a ground voltage level. The discharge operation S21 may be performed in a stand-by state of the memory device.

When the first bit line BL0 is discharged and then a read operation command is input from the outside, the memory device may perform the precharge operation S23 to precharge the first bit line BL0 to a predetermined voltage, for example, a power voltage level. Also, the memory device may apply a predetermined voltage, for example, a first voltage V1, to each of the first and second word lines WL0 and WL1. In other words, to perform the read operation, the first voltage V1 may be applied from the outside, for example, a voltage controller (not shown), to each of the first word line WL0 connected to the selected first memory cell MC0 and the second word line WL1 connected to the selected second memory cell MC1.

Also, a second voltage V2 may be applied by the voltage controller to the word lines WLm connected to the memory cells MCn except for the selected first and second memory cells MC0 and MC1. The first voltage V1 may be a ground voltage and the second voltage V2 may be a voltage greater than the first voltage V1, for example, a read voltage greater than a threshold voltage level of the memory cell. After the first bit line BL0 is precharged, the memory device may perform the develop operation S25 on the first bit line BL0 according to the statuses of the first and second memory cells MC0 and MC1.

Referring to FIG. 4, when the statuses of the selected first and second memory cells MC0 and MC1 are both ON, the voltage precharged to the first bit line BL0, that is, the power voltage level, may be gradually decreased. Also, when the statuses of the selected first and second memory cells MC0 and MC1 are both OFF, the power voltage level precharged to the first bit line BL0 may be maintained.

After the first bit line BL0 is developed, the memory device may sense a change in the voltage level of the developed first bit line BL0 (S26) and output a sensing result as a result of the first read operation. Referring to Table 1, as a result of the first read operation of the memory device, when the statuses of the first and second memory cells MC0 and MC1 are both ON, a first status, for example, an ON status, may be output. The result of the output first read operation may be stored in a buffer (not shown) of the memory device.

When the first read operation is completed, the memory device may perform the second read operation S30 including a develop operation S35 and a sensing operation S36. When the first read operation is completed, the first voltage V1 may be applied to the first word line WL0 connected to the first memory cell MC0 and the second voltage V2 may be applied to the second word line WL1 connected to the second memory cell MC1. Likewise, the second voltage V2 may be applied to each of the word lines WLm respectively connected to the other memory cells MCn except for the selected first and second memory cells MC0 and MC1.

Also, the first bit line BL0 may be in a status of being precharged to the power voltage level by the above-described first read operation. When the first and second voltages V1 and V2 are respectively applied to the first and second word lines WL0 and WL1, the memory device may perform the develop operation S35 on the first bit line BL0 according to the statuses of the first and second memory cells MC0 and MC1.

After the first bit line BL0 is developed, the memory device may sense a change in the voltage level of the developed first bit line BL0 (S36) and output a sensing result as a result of the second read operation. The develop operation S35 and the sensing operation S36 of the second read operation of the memory device may be substantially similar to the develop and sensing operations S25 and S26 of the first read operation. Referring to Table 1, the result of the second read operation of the memory device may be the same as the status of the first memory cell MC0. Accordingly, the memory device may in S40 determine the status of the first memory cell MC0 from the result of the second read operation. Also, the output result of the second read operation may be stored in the buffer (not shown) of the memory device, like the result of the first read operation.

When the second read operation is completed, the memory device may perform the third read operation S50 including a develop operation S55 and a sensing operation S56. When the second read operation is completed, the second voltage V2 may be applied to the first word line WL0 connected to the first memory cell MC0 and the first voltage V1 may be applied to the second word line WL1 connected to the second memory cell MC1. Likewise, the second voltage V2 may be applied to the word lines WLm connected to the other memory cells MCn except of the selected first and second memory cells MC0 and MC1.

Also, the first bit line BL0 may be precharged to the power voltage level by the first read operation or second read operation. When the second voltage V2 and the first voltage V1 are respectively applied to the first word line WL0 and the second word line WL1, the memory device may perform the develop operation S55 on the first bit line BL0 according to the statuses of the first and second memory cells MC0 and MC1.

After the first bit line BL0 is developed, the memory device may sense a change in the voltage level of the developed first bit line BL0 (S56) and output a sensing result as a result of the third read operation. The develop operation S55 and the sensing operation S56 of the third read operation of the memory device may be substantially similar to the develop operations S25 and S35 and the sensing operations S26 and S36 of the first and second read operations. Also, the output result of the third read operation may be stored in the buffer of the memory device, like the result of the first and second read operations.

The status of the second memory cell MC1 may be determined by combining the results of the first, second, and third read operations (S60). Referring to Table 1, when the result of the first read operation is OFF, the result of the second read operation is OFF, and the result of the third read operation is OFF, the status of the second memory cell MC1 may be determined to be OFF. Also, when the result of the first read operation is ON, the result of the second read operation is ON, and the result of the third read operation is ON, the status of the second memory cell MC1 may be determined to be ON.

Also, when the result of the first read operation is OFF, the result of the second read operation is ON, and the result of the third read operation is ON, the status of the second memory cell MC1 may be determined to be OFF. When the result of the first read operation is OFF, the result of the second read operation is OFF, and the result of the third read operation is ON, the status of the second memory cell MC1 may be determined to be ON.

When the status of the second memory cell MC1 is determined, the memory device performs a recovery operation S70 on the first bit line BL0 to discharge the first bit line BL0 to the ground voltage level. Accordingly, the memory device may be returned to the stand-by state.

As described above, according to the read operation method of the memory device according to this exemplary embodiment of the inventive concept, at least three read operations, for example, the first read operation, the second read operation, and the third read operation, are sequentially performed so that the statuses of the first and second memory cells MC0 and MC1 to be read may be determined together.

The second and third read operations may have an operation time shorter than the first read operation. In other words, although the discharge operation S21, the precharge operation S23, the develop operation S25, and the sensing operation S26 are performed in the first read operation, only the develop operations S35 and S55 and the sensing operations S36 and S56 are performed in the second and third read operations. Accordingly, according to the read operation method of the memory device according to this embodiment of the inventive concept, the read speed may be increased to be faster than that of the read operation method of the conventional memory device. Also, since the frequency of application of a voltage to a plurality of word lines is reduced, the read disturb characteristic of the memory device may be improved.

Figure 5:
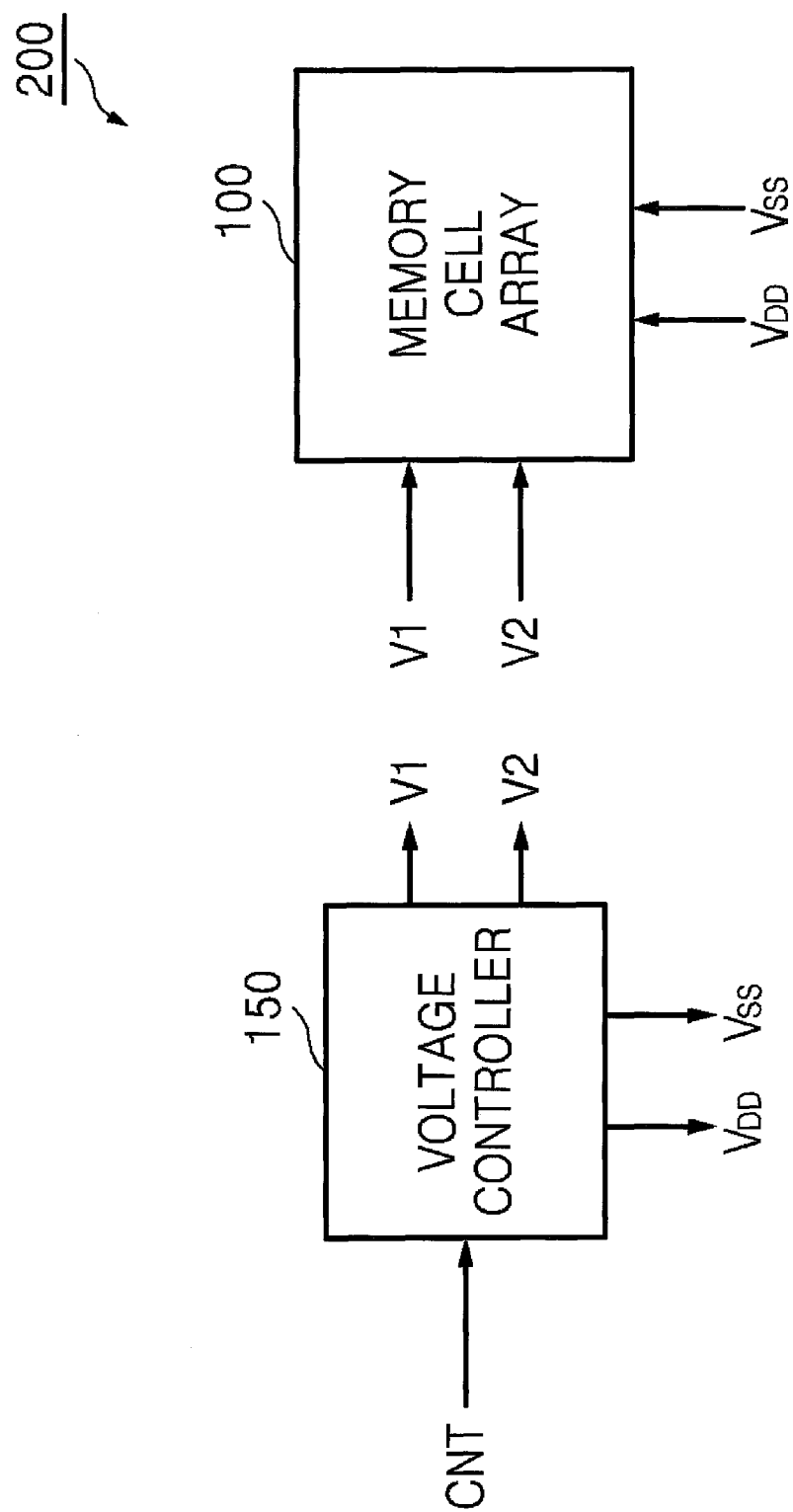
FIG. 5 is a schematic block diagram of a memory device using a read operation method of the memory device of FIGS. 1-4.

FIG. 5 is a schematic block diagram of a memory device 200 using the read operation method of the memory device of FIGS. 1-4. Referring to FIGS. 1 and 5, the memory device 200 may include the memory cell array 100 and a voltage controller 150. Since the memory cell array 100 is the same as the memory cell array 100 of FIG. 1, a detailed description thereof will be omitted.

The voltage controller 150 may generate and output a plurality of voltages in response to a control signal CNT provided from the outside. For example, the voltage controller 150 may output the first voltage V1 and the second voltage V2 respectively applied to the word lines WL0, WL1, . . . , WLm of the memory cell array 100. Also, the voltage controller 150 may output the power voltage VDD and the ground voltage VSS respectively applied to the bit lines BL0 and BL1 of the memory cell array 100.

The memory device 200 may be mounted or embedded by using a variety of packages. For example, the memory device 200 may be mounted or embedded by using a package such as PoP (Package on Package), ball grid arrays (BGAs), chip scale packages (CSPs), a plastic leaded chip carrier (PLCC), a plastic dual in-line package (PDIP), die in waffle pack, die in wafer form, chip on board (COB), a ceramic dual in-line package (CERDIP), a plastic metric quad flat pack (MQFP), a thin quad flatpack (TQFP), small outline (SOIC), a shrink small outline package (SSOP), a thin small outline (TSOP), a thin quad flatpack (TQFP), system in package (SIP), a multi chip package (MCP), a wafer-level fabricated package (WFP), and a wafer-level processed stack package (WSP).

Figure 6:
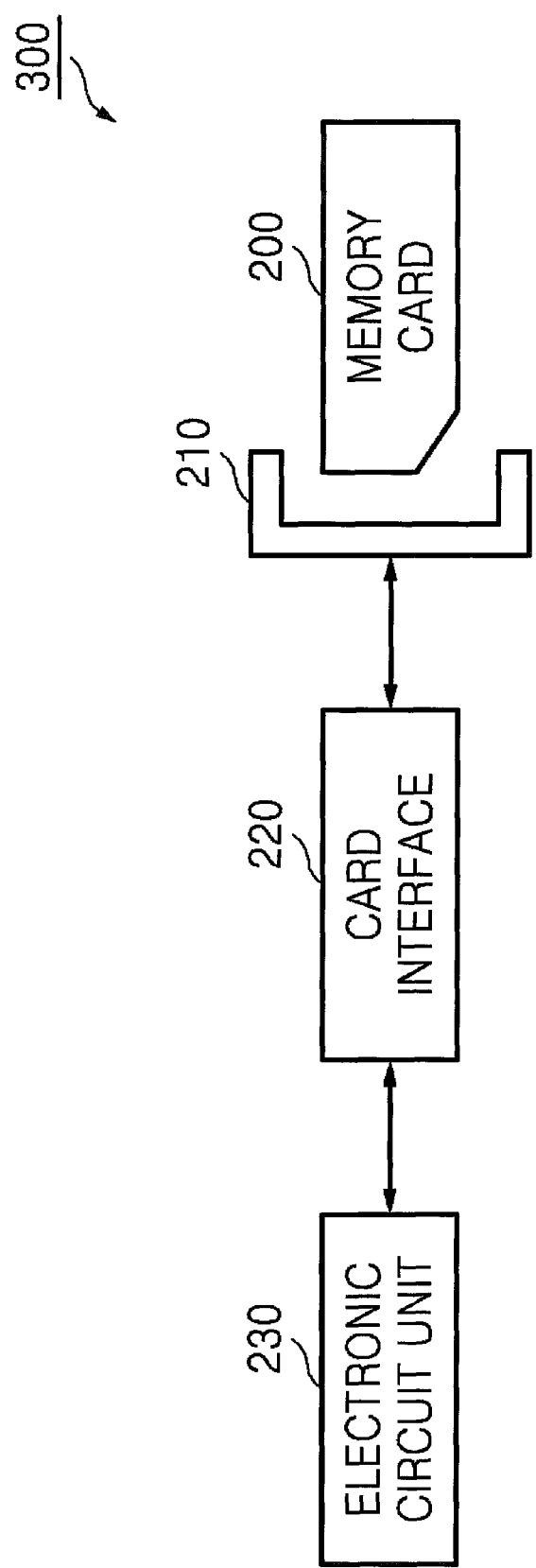
FIG. 6 is a block diagram showing an example of an electronic system including the memory device of FIG. 5.
Figure 7:
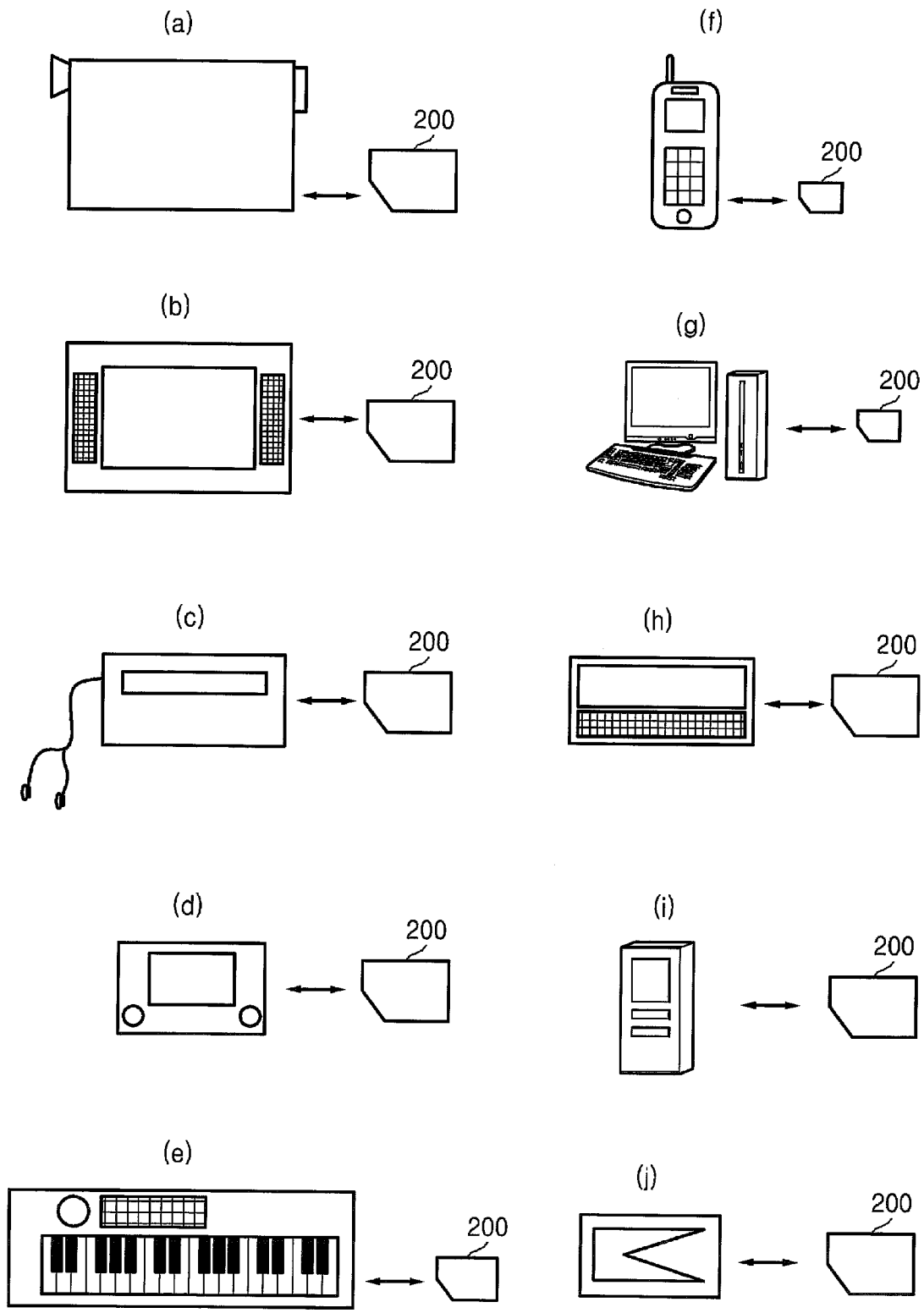
FIGS. 7A-7J illustrate a variety of exemplary embodiments of electronic systems including the memory device of FIG. 5.

FIG. 6 is a block diagram showing an example of an electronic system 300 including the memory device 200 of FIG. 5. FIGS. 7A-7J illustrate a variety of exemplary embodiments of electronic systems including the memory device 200 of FIG. 5. Referring to FIGS. 6-7J, the memory device 200 may be implemented by a memory card including, for example, a secure digital (SD) card or a multi-media card (MMC). Also, the memory card may include smart card.

The memory card 200 may be used with a video camera of FIG. 7A, a TV or IPTV of FIG. 7B, an MP3 player of FIG. 7C, an electronic game console or navigation of FIG. 7D, an electronic musical instrument of FIG. 7E, a portable communications terminal such as a cellular phone of FIG. 7F, a personal computer (PC) of FIG. 7G, a personal digital assistant (PDA) of FIG. 7H, a voice recorder of FIG. 7I, or a PC card or memory card reader of FIG. 7J.

Thus, when each of the video camera of FIG. 7A, the TV or IPTV of FIG. 7B, the MP3 player of FIG. 7C, the electronic game console or navigation of FIG. 7D, the electronic musical instrument of FIG. 7E, the portable communications terminal such as a cellular phone of FIG. 7F, the PC of FIG. 7G, the PDA of FIG. 7H, the voice recorder of FIG. 7I, or the PC card or memory card reader of FIG. 7J includes a card interface 220 and a slot or connection unit 210 that may be connected to the card interface 220, the memory card 200 may be electrically connected to the slot or connection unit 210 to communicate a predetermined data or command, through the card interface 220, with a CPU or microprocessor (not shown) provided in an electronic circuit 230 of each of the video camera of FIG. 7A, the TV or IPTV of FIG. 7B, the MP3 player of FIG. 7C, the electronic game console or navigation of FIG. 7D, the electronic musical instrument of FIG. 7E, the portable communications terminal such as a cellular phone of FIG. 7F, the PC of FIG. 7G, the PDA of FIG. 7H, the voice recorder of FIG. 7I, or the PC card or memory card reader of FIG. 7J.

As described above, according to the read operation method of a memory device according to the present inventive concept, since the read operation performance of the memory device is improved, the read operation speed may be increased. Also, since the frequency of application of a voltage to a plurality of word lines is reduced during the read operation, the read disturb characteristic of the memory device may be improved.

While the inventive concept has been particularly shown and described with reference to exemplary embodiments thereof, it will be understood that various changes in form and details may be made therein without departing from the spirit and scope of the following claims.

What is claimed is:

1. A read operation method of a memory device, the method comprising:
   applying a first voltage to each of a first memory cell and a second memory cell during a first read operation;
   applying the first voltage to the first memory cell and a second voltage to the second memory cell during a second read operation; and
   applying the second voltage to the first memory cell and the first voltage to the second memory cell during a third read operation.

2. The read operation method of claim 1, wherein each of a time of the second read operation and a time of the third read operation is shorter than a time of the first read operation.

3. The read operation method of claim 1, wherein the second read operation comprises:
   developing a bit line to which the first and second memory cells are connected, according to a status of the first memory cell and a status of the second memory cell; and
   sensing a result of said developing and outputting a result of the second read operation, and determining the status of the first memory cell from a result of the first read operation and the result of the second read operation.

4. The read operation method of claim 1, wherein the third read operation comprises:
   developing a bit line to which the first and second memory cells are connected, according to a status of the first memory cell and a status of the second memory cell; and
   sensing a result of said developing and outputting a result of the third read operation, and determining the status of the second memory cell from a result of the first read operation, a result of the second read operation, and the result of the third read operation.

5. The read operation method of claim 1, wherein the first read operation comprises:
   precharging a bit line to which the first and second memory cells are connected;
   developing the bit line according to a status of the first memory cell and a status of the second memory cell; and
   sensing a result of said developing and outputting a result of the first read operation.

6. The read operation method of claim 5, wherein when said sensing a result of said developing and the outputting of a result of the first read operation is carried out when the status of the first memory cell and the status of the second memory cell are both ON, the result of the first read operation is output as ON.

7. The read operation method of claim 5, further comprising discharging the bit line, before said precharging the bit line to which the first and second memory cells are connected.

8. The read operation method of claim 1, further comprising recovering a bit line to which the first and second memory cells are connected, after the third read operation is performed.

9. The read operation method of claim 1, wherein the first voltage is lower than the second voltage.

10. The read operation method of claim 1, wherein each of the first and second memory cells is a NAND flash memory cell.

11. The read operation method of claim 1, wherein each of the first and second memory cells is a NOR flash memory cell.

12. A read operation method of a memory device, the method comprising:
   applying a first voltage to each of a first memory cell and a second memory cell during a first read operation;
   applying the first voltage to the first memory cell and a second voltage to the second memory cell during a second read operation;
   determining a status of the first memory cell based on the first and second read operations;
   applying the second voltage to the first memory cell and the first voltage to the second memory cell during a third read operation; and
   determining a status of the second memory cell based on the first, second and third read operations,
   wherein the second voltage is greater than the first voltage.

13. The read operation method of claim 12, wherein the first voltage is ground.

14. The read operation method of claim 13, wherein the second voltage is greater than a threshold voltage level of the first and second memory cells.

15. The read operation method of claim 12, wherein a duration of the second read operation and a duration of the third read operation is shorter than a duration of the first read operation.

16. The read operation method of claim 12, wherein the first and second memory cells are NAND flash memory cells.

17. The read operation method of claim 12, wherein the first and second memory cells are NOR flash memory cells.

* * * * *